United States Patent
Zhang et al.

(10) Patent No.: US 12,101,089 B2
(45) Date of Patent: Sep. 24, 2024

(54) ENHANCED RISING AND FALLING TRANSITIONS FOR LEVEL SHIFTING LOW-VOLTAGE INPUT SIGNALS

(71) Applicant: QUALCOMM Incorporated, San Diego, CA (US)

(72) Inventors: Xu Zhang, San Diego, CA (US); Xuhao Huang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/970,519

(22) Filed: Oct. 20, 2022

(65) Prior Publication Data

US 2024/0137022 A1 Apr. 25, 2024
US 2024/0235552 A9 Jul. 11, 2024

(51) Int. Cl.
*H03K 19/01* (2006.01)
*H03K 3/037* (2006.01)
*H03K 19/0185* (2006.01)
*H04M 1/02* (2006.01)

(52) U.S. Cl.
CPC ..... *H03K 19/018521* (2013.01); *H03K 3/037* (2013.01); *H04M 1/026* (2013.01)

(58) Field of Classification Search
CPC ......... H03K 3/35613; H03K 3/356156; H03K 19/0013; H03K 19/017509; H03K 19/01806; H03K 19/018507; H03K 19/018514; H03K 19/018521; H03K 19/018528

USPC ......................................................... 327/333
See application file for complete search history.

(56) References Cited

U.S. PATENT DOCUMENTS

| | | | |
|---|---|---|---|
| 2004/0169542 A1* | 9/2004 | Kouzuma | H03K 3/012 327/333 |
| 2008/0136489 A1* | 6/2008 | Nojiri | H03K 3/013 327/333 |
| 2009/0002026 A1* | 1/2009 | Kanzaki | H03K 19/018521 326/80 |
| 2011/0050746 A1 | 3/2011 | Tsuchi | |
| 2013/0257505 A1* | 10/2013 | Chiang | H03K 19/0185 327/333 |
| 2020/0028495 A1* | 1/2020 | Song | H03K 3/037 |
| 2021/0288649 A1* | 9/2021 | Ye | H03K 19/018528 |

OTHER PUBLICATIONS

International Search Report and Written Opinion—PCT/US2023/034678—ISA/EPO—Feb. 12, 2024.

* cited by examiner

*Primary Examiner* — Quan Tra
(74) *Attorney, Agent, or Firm* — Haynes and Boone, LLP

(57) ABSTRACT

A level-shifter is provided with a first transistor and a second transistor. The first transistor functions to discharge an internal node responsive to an assertion of an inverted input signal to a first power supply voltage. A second transistor functions to discharge an inverted level-shifter output signal responsive to an assertion of an input signal to the first power supply voltage. An inverter inverts the inverted level-shifter output signal to form a level-shifter output signal that is asserted to a second power supply voltage responsive to the assertion of the input signal.

10 Claims, 4 Drawing Sheets

ENHANCED RISING AND FALLING TRANSITIONS FOR LEVEL SHIFTING LOW-VOLTAGE INPUT SIGNALS

TECHNICAL FIELD

This application relates to level-shifters, and more particularly, to a level-shifter with enhanced rising and falling transitions for level shifting low-voltage input signals.

BACKGROUND

For reduced power consumption and other benefits, an integrated circuit may generate relatively low-voltage signals that oscillate between ground and a binary-high voltage that may barely satisfy or even be slightly less than a transistor threshold voltage. The resulting low-voltage signal may then need to be level shifted into a higher voltage power domain. Since the binary-high state of the low-voltage signal is barely satisfying or even less then the transistor threshold voltage, it is challenging to design a suitable level-shifter. For example, a cross-coupled latch-based level-shifter or an amplifier-based level-shifter may consume excessive power, require too many devices, and suffer from duty-cycle distortion when used to level shift low-voltage signals.

SUMMARY

A level-shifter is provided that includes: a first inverter configured to invert an input signal into an inverted input signal, the first inverter being powered by a first power supply voltage: a first transistor coupled between an internal node and ground and having a gate coupled to an output terminal of the first inverter; a second transistor coupled between ground and an inverted level-shifter output signal node for an inverted level-shifter output signal, the second transistor having a gate coupled to the input signal: a third transistor coupled between the internal node and a power supply node for a second power supply voltage: a second inverter configured to invert the inverted level-shifter output signal into a level-shifter output signal, the second inverter being powered by the second power supply voltage: and a buffer configured to buffer the level-shifter output signal into a feedback signal, wherein a gate of the third transistor is coupled to an output terminal of the buffer, and wherein the buffer is powered by the second power supply voltage.

In addition, a method of level-shifting is provided that includes: charging an inverted input signal to a first power supply voltage responsive to a discharging of an input signal: switching on a first transistor to discharge an internal node responsive to the charging of the inverted input signal while switching off a second transistor coupled between an inverted level-shifter output signal node and ground responsive to the discharging of the input signal and while a third transistor coupled between the internal node and a power supply node for a second power supply voltage is off: switching on a fourth transistor coupled between the inverted level-shifter output signal node and a power supply node for a second power supply voltage to charge an inverted level-shifter output signal at the inverted level-shifter output signal node to the second power supply voltage responsive to the discharge of the internal node: discharging a level-shifter output signal responsive to the charging of the inverted level-shifter output signal to the second power supply voltage: discharging a feedback signal responsive to the discharging of the level-shifter output signal: and switching on the third transistor responsive to the discharging of the feedback signal.

A level-shifter is also provided that includes: a first inverter configured to invert an input signal into an inverted input signal, the first inverter being powered by a first power supply voltage: a first transistor coupled between an internal node and ground and having a gate coupled to an output terminal of the first inverter: a second transistor coupled between ground and an inverted level-shifter output signal node for an inverted level-shifter output signal, the second transistor having a gate coupled to the input signal: and a third transistor coupled between the inverted level-shifter output signal node and a power supply node for a second power supply voltage, wherein a gate of the third transistor is coupled to the internal node.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figure.

DETAILED DESCRIPTION

A level-shifter is provided that may advantageously level shift relatively low-voltage signals (e.g., as low as the threshold voltage of a metal-oxide semiconductor field-effect transistor (MOSFET)). This level shifting is stable to process, voltage, and temperature (PVT) variations yet has a relatively low power consumption and utilizes relatively few devices. In addition, the matching requirements of transistors in the level-shifter are relaxed, which eases the design and manufacture process. In contrast, amplifier-based and cross-coupled-latch-based level-shifters may not be able to successfully level shift such relatively low-voltage signals, consume more power, require more devices, and have more stringent device matching requirements.

To provide these advantageous features, one implementation of the disclosed level-shifter includes a first inverter that inverts an input signal into an inverted input signal. The first inverter is powered by a first power supply voltage. In the following discussion, it will be assumed that the input signal is being level shifted into a level-shifter output signal in a higher voltage power domain powered by a second power supply voltage that is greater than the first power supply voltage. However, it will be appreciated that alternative implementations of the level-shifter may shift the input signal from a high voltage power domain into a level-shifter output signal in a lower voltage power domain.

Assuming that the input signal has an active-high convention, its binary high state may be relatively low voltage such as the threshold voltage or even lower as noted earlier. To accommodate such a low-voltage signal, the inverted input signal drives a gate of a first N-type metal-oxide semiconductor (NMOS) transistor that functions to discharge an internal node in the level-shifter when the inverted input signal is asserted to a binary-high logical state. The input signal similarly drives a gate of a second NMOS transistor that functions to discharge an inverted level-shifter output signal node when the input signal is asserted to a binary-high logical state. A second inverter powered by the second power supply voltage functions to invert an inverted level-shifter output signal carried on the inverted level-shifter output signal node to produce a level-shifter output signal. The first and second transistors form the major input transistor pair for the level-shifter but have no matching requirement, which eases the design and manufacture of the level-shifter.

Figure 1:
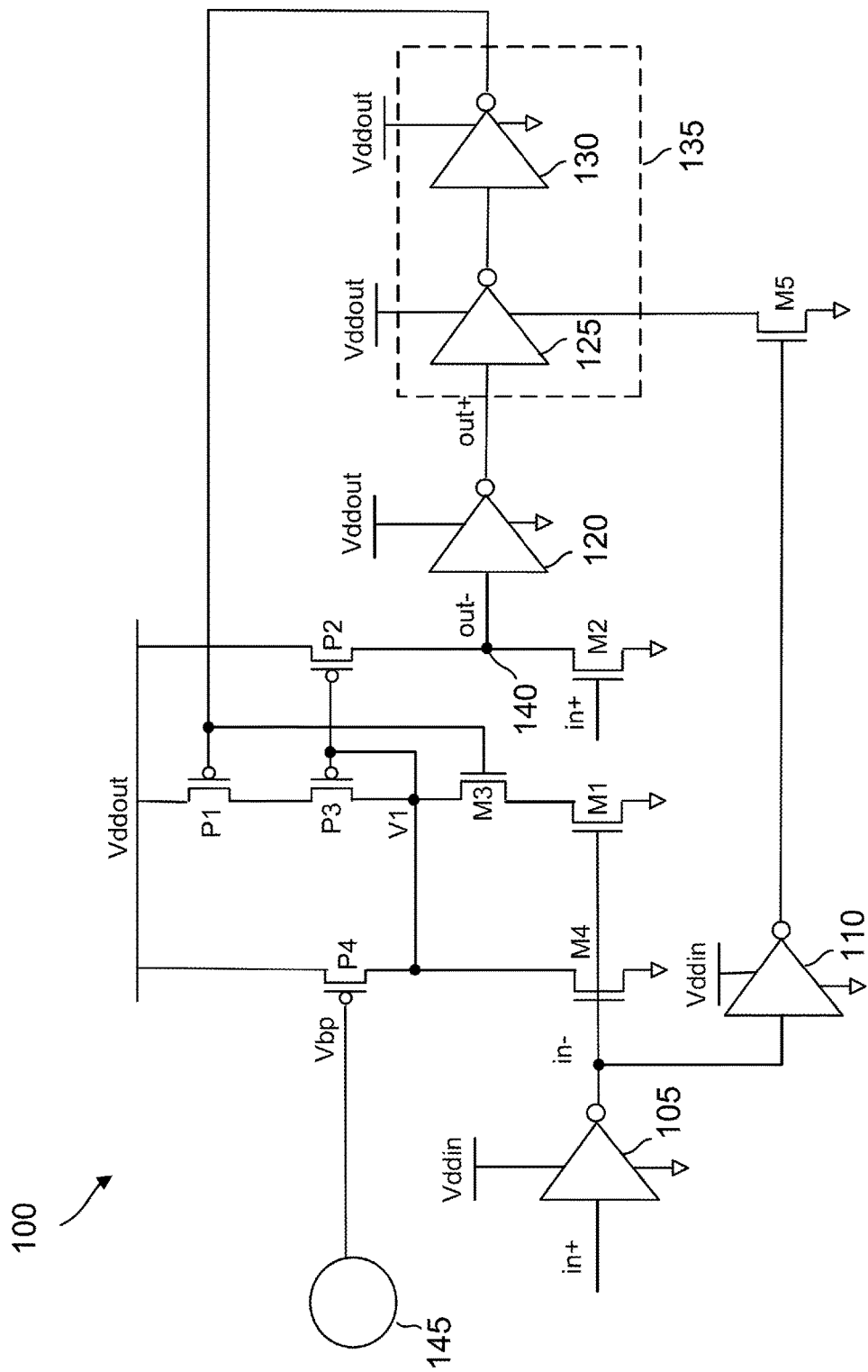
FIG. 1 is a circuit diagram of an example level-shifter in accordance with an aspect of the disclosure.

An example level-shifter 100 is shown in FIG. 1. An inverter 105 is an example of the first inverter discussed above that inverts the input signal to form the inverted input signal. A transistor M1 is an example of the first NMOS transistor that in level-shifter 100 functions to discharge an internal node V1 in response to an assertion of an inverted input signal (in−). An output terminal of first inverter 105 couples to a gate of transistor M1. The first inverter 105 as powered by a first power supply voltage (Vddin) functions to invert an input signal (in+) to form the inverted input signal in−. Similarly, transistor M2 is an example of the second NMOS transistor that functions in level-shifter 100 to discharge an inverted level-shifter output signal node 140 that carries an inverted level-shifter output signal (out−). An input signal in+ drives the gate of transistor M2. The inverted input signal in− is the complement of the input signal in+. Similarly, the inverted level-shifter output signal out− is the complement of a level-shifter output signal (out+). A second inverter 120 is powered by an output domain power supply voltage (Vddout) and inverts the inverted level-shifter output signal out− to form the level-shifter output signal out+.

To provide a strong rising edge (the transition from a binary low state to a binary high state) to the inverted level-shifter output signal out− and thus form a strong falling edge (the transition from the binary high state to the binary low state) to the level-shifter output signal out+, transistor M1 functions as follows to strongly discharge the internal node V1 and trigger a strong charging of the inverted level-shifter output signal node 140. To provide a better appreciation of this discharging of the internal node V1, some supporting structure will first be discussed. Transistor M1 has a source coupled to ground and a drain coupled to a source of an NMOS transistor M3 having a drain coupled to the internal node V1. Transistor M3 is also referred to herein as a fifth transistor. A first PMOS transistor P1 has a source coupled to a power supply node for the output domain power supply voltage Vddout and a drain coupled to a source of a diode-connected PMOS transistor P3. Transistor P1 is also referred to herein as a third transistor. Transistor P3 is also referred to herein as a sixth transistor. The gate and drain of transistor P3 are coupled to internal node V1. A buffer 135 delays the level-shifter output signal out+ to form a feedback signal (Vfb) that drives the gates of transistors P1 and M3. The gates of transistors P1 and M3 are thus coupled to an output terminal of buffer 135. In addition, a PMOS transistor P2 has a source coupled to the power supply node for the second power supply voltage Vddout and has a drain coupled to the inverted level-shifter output signal node 140. The internal node V1 couples to the gate of transistor P2. Transistor P2 is also denoted herein as a fourth transistor or as a third transistor.

As will be explained further herein, the feedback signal Vfb is delayed with respect to the level-shifter output signal out+. Given this delay, the feedback signal Vfb will still be charged to the second power supply voltage Vddout at the rising edge of the inverted input signal in− (the rising edge being the transition from ground to the first power supply voltage Vddin). Transistor P1 will thus be off and transistor M3 will be on at the rising edge of the inverted input signal in−. This assertion of the inverted input signal in− switches on transistor M1 to quickly discharge the internal node V1 which then strongly switches on transistor P2. Transistor M2 is switched off at the rising edge of the inverted input signal in− so that the switching on of transistor P2 quickly charges the inverted level-shifter output signal node 140 to the second power supply voltage Vddout. The rising edge of the inverted level-shifter output signal out− is thus strongly enhanced through the rapid discharging of the internal node V1 by transistor M1.

With the inverted level-shifter output signal out− being asserted in response to the assertion of the inverted input signal in−, inverter 120 then discharges the level-shifter output signal out+ to ground, which causes the feedback signal Vfb to also be discharged after the propagation delay has elapsed through buffer 135. Transistor P1 is thus switched on and transistor M3 switched off. This switching on of transistor P1 would charge the internal node V1 to the second power supply voltage Vddout in implementations in which transistor P3 is eliminated. Although such implementations are feasible, note that such an assertion of the internal node V1 voltage will switch off transistor P2. Since transistor M2 is off due to the input signal in+ being discharged, inverted level-shifter output signal node 140 will then float. This may be manageable since the desired charged state of the inverted level-shifter output signal node 140) was assured at the rising edge of the inverted input signal in− due to transistor M1 discharging the internal node V1. But with both transistors P2 and M2 being off, inverted level-shifter output signal node 140 will then float such that its voltage is unpredictable and will depend upon the leakage current in transistors P1 and M2. It is thus possible that the inverted level-shifter output signal node 140 would undesirably be discharged below the threshold voltage of inverter 120 during the binary zero state duration or period of the input signal in+. Such a discharge would then cause inverter 120 to erroneously charge the level-shifter output signal out+ when it should be discharged. But transistor P3 advantageously prevents this floating of the inverted level-shifter output signal node 140 while the input signal in+ is discharged.

At the power up of level-shifter 100, note that the binary state of the input signal in+ is unknown. This unknown binary state could then lead to an ambiguous (and possibly undesirable) binary state for the level-shifter output signal out +. To provide a defined and non-ambiguous starting binary state for the level-shifter output signals out+ and out−, level-shifter 100 may include an NMOS transistor M4 and a PMOS transistor P4. Transistor M4 has a source coupled to ground and a drain coupled to the internal node V1. Transistor M4 is also referred to herein as a seventh transistor or a fourth transistor whereas transistor P4 is also denoted as an eighth transistor or a fifth transistor. The inverted input signal in− drives the gate of transistor M4. Transistor P4 couples between the internal node V1 and the power supply node for the second power supply voltage Vddout. A bias voltage Vbp that has a value between ground and Vddout (e.g., approximately ½ Vddout) as generated by a bias voltage source 145 biases the gate of transistor P4.

Transistor P4 is thus slightly on whenever level-shifter 100 is powered on and will tend to charge the internal node V1. Since the function of the bias voltage Vbp is thus to cause transistor P4 to be slightly on, bias voltage source 145 need not be a high-performance bias voltage source such as a bandgap reference. A lower cost design for bias voltage source 145 may thus be used in some implementations.

At power up of level-shifter 100, input signal in+ may be a binary zero or it may be a binary one. Suppose that at power up, input signal in+ is a binary zero. In that case, the level-shifter output signal out+ should also be a binary zero. To ensure that the level-shifter output signal out+ is indeed a binary zero with the input signal in+ being as a binary zero at power up, transistor M4 is larger than transistor P4. With the input signal in+ starting as a binary zero, inverter 105 will thus assert the inverted level-shifter output signal out− to the first power supply voltage Vddin, which switches on transistor M4 and causes the internal node V1 to be partially discharged to some intermediary voltage between ground and the second power supply voltage Vddout. This intermediary voltage partially switches transistor P2 on, which causes the inverted level-shifter output signal out− to be charged towards the second power supply voltage Vddout. Transistor M2 is off since the input signal in+ is a binary zero. Inverter 120 will thus discharge the level-shifter output signal out+ in response to the input signal in+ being a binary zero at power up. To ensure that this non-ambiguous state occurs in response to the input signal in+ being a binary zero at power up, transistor M4 may be larger than transistor P4 (e.g., 8 times larger in one implementation).

If instead the input signal in+ is a binary one at the power up of level-shifter 100, transistor M4 is off. Transistor P4 will thus charge internal node V1 towards Vddout, which helps shut off transistor P2. Transistor M2 can thus discharge the inverted level-shifter output signal out− without any struggle with transistor P2 causing a possibility of an ambiguous state for the inverted level-shifter output signal out−. The level-shifter output signal out+ is thus a binary one when the input signal in+ is a binary one at the power-up of level-shifter 100. With level-shifter 100 thus protected from ambiguous startup states, additional details during operation of level-shifter 100 will now be discussed.

As noted earlier, transistor M1 functions to strongly discharge internal node V1 at the rising edge of the inverted input signal in−. This discharge is shown in the timing diagram of FIG. 2 at a time B. After the input signal in+ is discharged, the feedback signal Vfb is also discharged to switch transistor M3 off. There is thus no significant static current conducting through transistor M1 while the inverted input signal in− is charged to Vddin. At the rising edge of the input signal in+, transistor M2 switches on to discharge the inverted level-shifter output signal node 140. This rising edge of the input signal in+ eventually produces a corresponding rising edge in the feedback signal Vfb (a transition of the feedback signal Vfb to the second power supply voltage Vddout) as shown as a time A in FIG. 2. Prior to the rising edge in the feedback signal Vfb, transistor P1 is on and transistor P4 is slightly on. The rising edge in the input signal in+ causes the inverted input signal in− to have a falling edge (transition to ground) so that transistor M4 is off. With transistor P1 being on and transistor P4 being slightly on, the internal node V1 voltage rises rapidly just prior to time A. This rise in the internal node voltage V1 is advantageous because it substantially switches off transistor P2. In this fashion transistor M2 does not struggle with transistor P2 as transistor M2 discharges the inverted level-shifter output signal node 140. To ensure that there is sufficient delay between the rising edge of the input signal in+ and the rising edge of the feedback signal Vfb to allow the rapid charging of the internal node V1 voltage, level-shifter 100 includes a fifth inverter 110 and an NMOS transistor M5. Transistor M5 is also referred to herein as a ninth transistor. The operation of inverter 110 and transistor M5 will now be discussed in more detail.

Inverter 110 is powered by the first power supply voltage Vddin and inverts the inverted input signal in− to drive the gate of transistor M5. Transistor M5 will thus only switch on in response to the rising edge of the input signal in+ following the propagation delay of inverters 105 and 110. Transistor M5 couples between ground and a ground terminal of a third inverter 125 in buffer 135. In response to the rising edge of the input signal in+, transistor M2 switches on to discharge the inverted level-shifter output signal node 140, which causes inverter 120 to charge the level-shifter output signal out+ to the second power supply voltage Vddout. This charging of the level-shifter output signal out+ will cause inverter 125 to discharge its output terminal once transistor M5 is switched on. Buffer 135 includes a fourth inverter 130 that inverts the level-shifter output signal of inverter 125 to form the feedback signal Vfb. The feedback signal Vfb thus cannot have a rising edge until transistor M5 is switched on following the propagation delay of the rising edge of the input signal in+ through inverters 105 and 110. It will be appreciated that transistor M5 and inverter 110 are optional and may be deleted should the intrinsic propagation delay from inverter 120 and buffer 135 be sufficiently large. Inverters 125 and 130 in buffer 135 are powered by the second power supply voltage Vddout.

Note that transistors M4 and P4 may be deemed to control the static states of level-shifter 100 such as preventing an ambiguous value to the level-shifter output signal out+ (and thus to the inverted output signal out−) at startup and maintaining the binary values of the level-shifter output signals between their binary transitions. In contrast, transistors M1, M2, M3, P1, P2, and P3 control the dynamic states of level-shifter 100 (the rising and falling edges of the level-shifter output signal out+ and the inverted level-shifter output signal out−). This decoupling of the static and dynamic control of level-shifter 100 is advantageous with respect to easing the design of level-shifter 100 as the sizes of transistors M4 and P4 is decoupled from the sizes of transistors M1, M2, M3, P1, P2, and P3. In addition, note that there is no matching pair of transistors in level-shifter 100 with regard to the dynamic states. For example, transistor M1 and M2 need not be matched. As compared to transistor M1, transistor M4 may be relatively small since the role of transistor M4 is to conduct a relatively small current for static operation. In contrast, transistor M1 may be relatively large to ensure the quick discharge of the internal node V1 voltage at time B as discussed with respect to the timing diagram of FIG. 2. For example, transistor M1 may be 6 times larger than transistor M4 in one implementation although it will be appreciated that alternative size ratios for transistors M1 and M4 may be used in alternative implementations.

Figure 2:
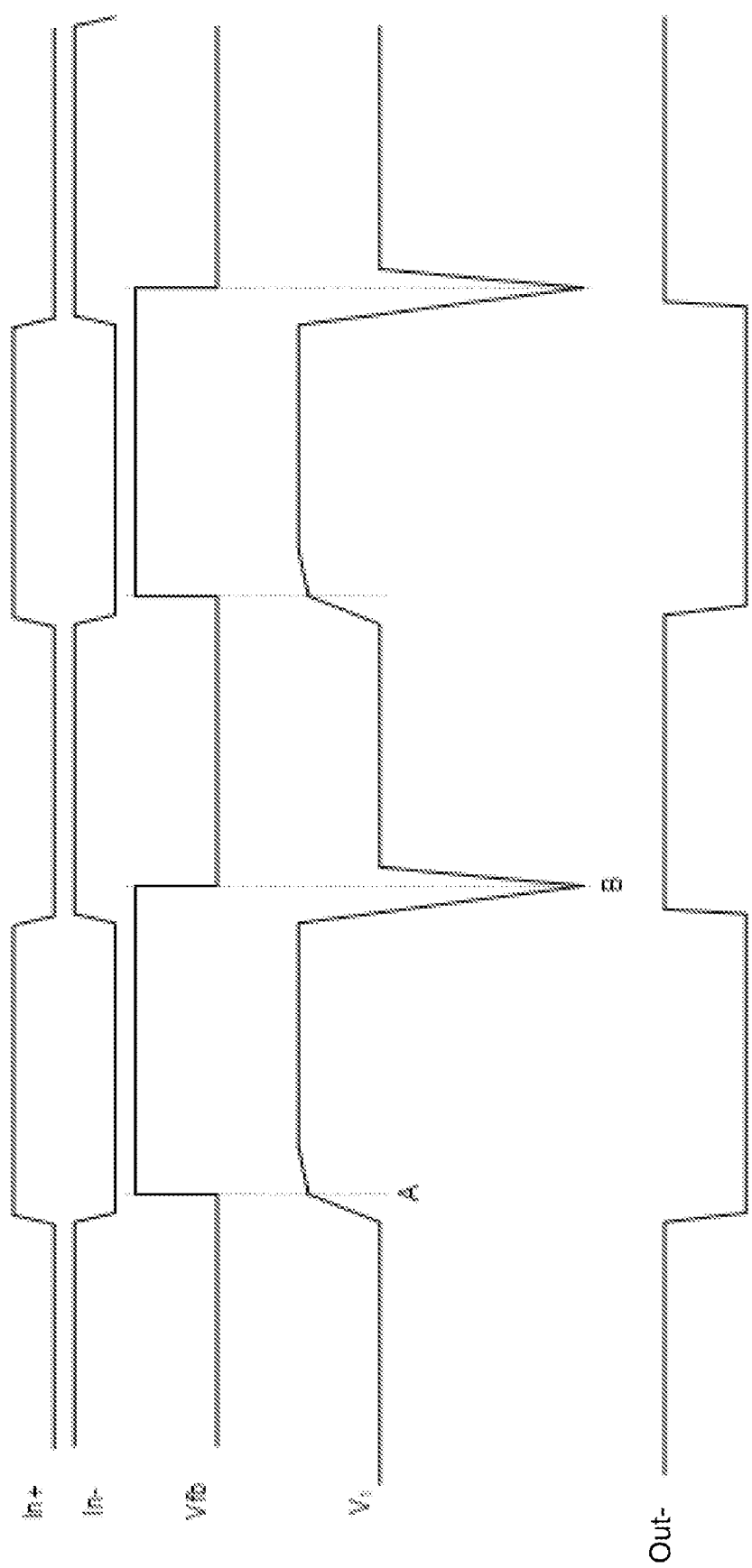
FIG. 2 is a timing diagram for signals of the level-shifter of FIG. 1.
Figure 3:
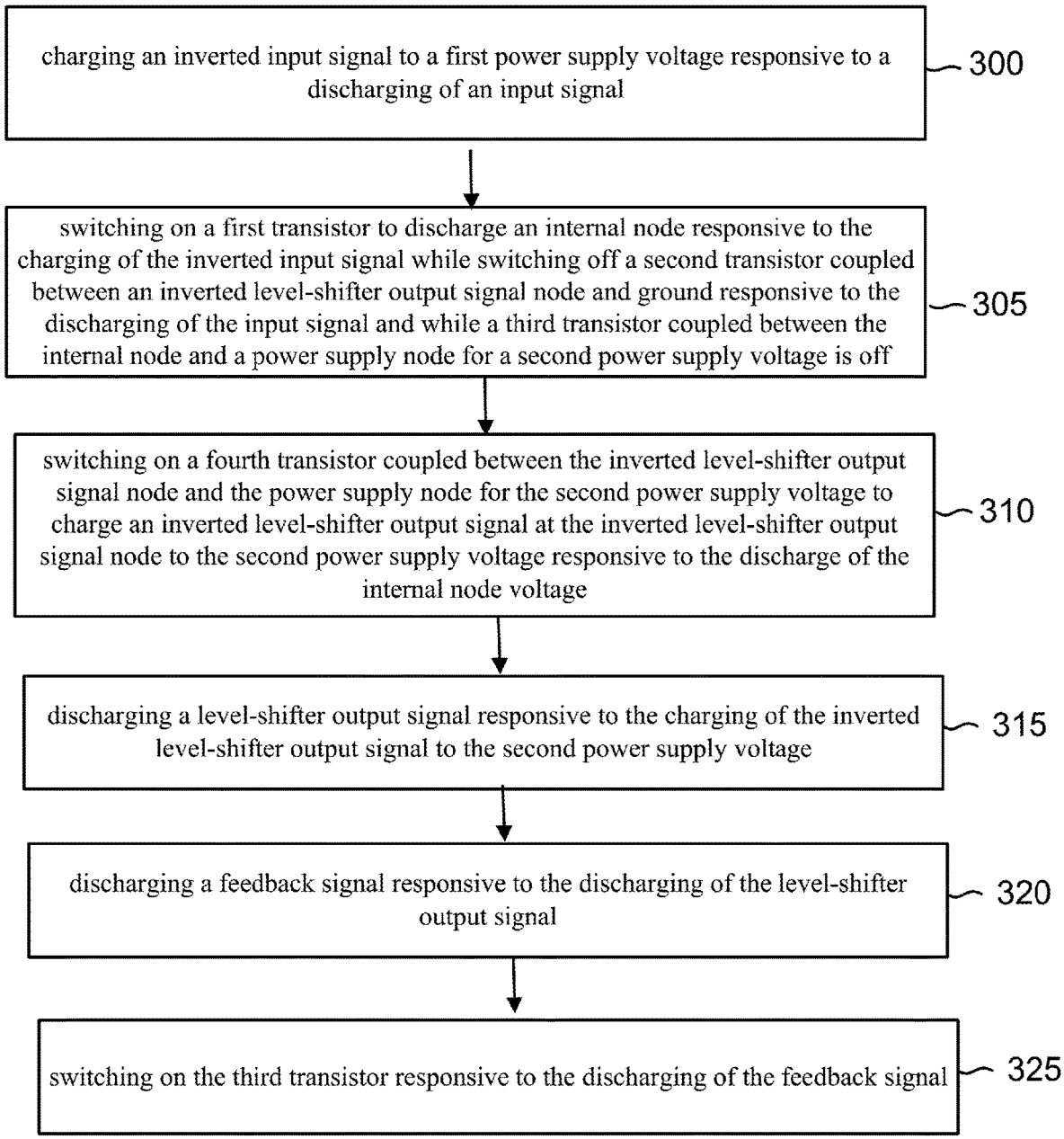
FIG. 3 is a flowchart for an example method of level-shifting in accordance with an aspect of the disclosure.

An example method of level-shifting will now be discussed with respect to the flowchart of FIG. 3. The method includes an act 300 of charging an inverted input signal to a first power supply voltage responsive to a discharging of an input signal. The rising edge of the inverted input signal in− responsive to the falling edge of the input signal in+ as shown in the timing diagram of FIG. 2 is an example of act 300. The method also includes an act 305 of switching on a first transistor to discharge an internal node responsive to the charging of the inverted input signal while switching off a second transistor coupled between an inverted level-shifter output signal node and ground responsive to the discharging of the input signal and while a third transistor coupled between the internal node and a power supply node for a second power supply voltage is off. The discharging of the internal node V1 at time B as shown in the timing diagram of FIG. 2 responsive to the switching on of transistor M1 while transistors M2 and P1 are off is an example of act 305. In addition, the method includes an act 310 of switching on a fourth transistor coupled between the inverted level-shifter output signal node and the power supply node for the second power supply voltage to charge an inverted level-shifter output signal at the inverted level-shifter output signal node to the second power supply voltage responsive to the discharge of the internal node voltage. The switching on of transistor P2 to charge the inverted level-shifter output signal node 140 at time B is an example of act 310. The method also includes an act 315 of discharging a level-shifter output signal responsive to the charging of the inverted level-shifter output signal to the second power supply voltage. The discharging of the level-shifter output signal out+ is an example of act 315. In addition, the method includes an act 320 of discharging a feedback signal responsive to the discharging of the level-shifter output signal. The discharging of the feedback signal Vfb at time B is an example of act 320. Finally, the method includes an act 325 of switching on the third transistor responsive to the discharging of the feedback signal. The switching on of transistor P1 at time B is an example of act 325.

Figure 4:
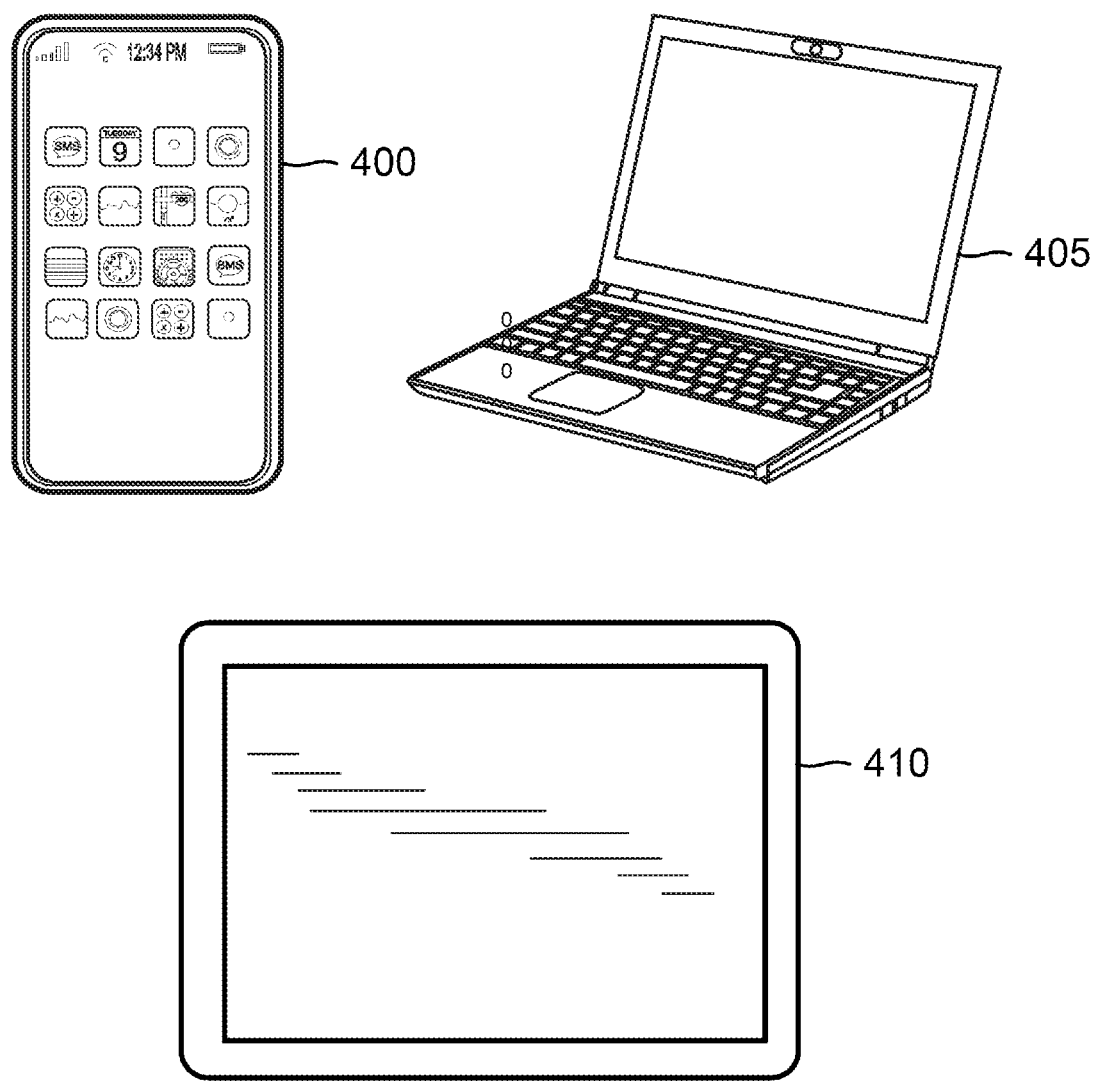
FIG. 4 illustrates some example electronic devices including a level-shifter in accordance with an aspect of the disclosure.

A level-shifter as disclosed herein may be incorporated in any suitable mobile device or electronic system. For example, as shown in FIG. 4, a cellular telephone 400, a laptop computer 405, and a tablet PC 410 may all include a level-shifter in accordance with the disclosure. Other exemplary electronic systems such as a music player, a video player, a communication device, and a personal computer may also be configured with a level-shifter constructed in accordance with the disclosure.

The disclosure will now be summarized in the following series of clauses:

Clause 1. A level-shifter, comprising:
  a first inverter configured to invert an input signal into an inverted input signal, the first inverter being powered by a first power supply voltage;
  a first transistor coupled between an internal node and ground and having a gate coupled to an output terminal of the first inverter:
  a second transistor coupled between ground and an inverted level-shifter output signal node for an inverted level-shifter output signal, the second transistor having a gate coupled to the input signal;
  a third transistor coupled between the internal node and a power supply node for a second power supply voltage;
  a second inverter configured to invert the inverted level-shifter output signal into a level-shifter output signal, the second inverter being powered by the second power supply voltage; and
  a buffer configured to buffer the level-shifter output signal into a feedback signal, wherein a gate of the third transistor is coupled to an output terminal of the buffer, and wherein the buffer is powered by the second power supply voltage.

Clause 2. The level-shifter of clause 1, further comprising:
  a fourth transistor coupled between the inverted level-shifter output signal node and the power supply node, the fourth transistor having a gate coupled to the internal node.

Clause 3. The level-shifter of any of clauses 1-2, further comprising:
  a fifth transistor coupled between the first transistor and the internal node, the fifth transistor having a gate coupled to the output terminal of the buffer.

Clause 4. The level-shifter of clause 2, wherein the first transistor, the second transistor, and the fifth transistor each comprises an n-type metal-oxide semiconductor (NMOS) transistor, and wherein the third transistor and the fourth transistor each comprises a p-type metal-oxide semiconductor (PMOS) transistor.

Clause 5. The level-shifter of any of clauses 1-4, further comprising:
  a sixth transistor coupled between the internal node and the third transistor, the sixth transistor having a gate coupled to the internal node.

Clause 6. The level-shifter of clause 5, further comprising:
  a seventh transistor coupled between the internal node and ground, the seventh transistor having a gate coupled to an output terminal of the first inverter.

Clause 7. The level-shifter of clause 6, wherein the first transistor is larger than the seventh transistor.

Clause 8. The level-shifter of clause 6, further comprising:
  an eighth transistor coupled between the internal node and the power supply node; and
  a voltage source configured to bias a gate of the eighth transistor with a bias voltage.

Clause 9. The level-shifter of clause 8, wherein the seventh transistor is larger than the eighth transistor.

Clause 10. The level-shifter of clause 8, wherein the buffer comprises a third inverter configured to invert the level-shifter output signal and comprises a fourth inverter configured to invert an output signal from the third inverter to form the feedback signal, the level-shifter further comprising:
  a fifth inverter configured to invert the inverted input signal, wherein the fifth inverter is powered by the first power supply voltage, and
  a ninth transistor coupled between ground and a ground terminal of the third inverter, wherein an output terminal of the fifth inverter is coupled to a gate of the ninth transistor.

Clause 11. The level-shifter of clause 10, wherein the third inverter and the fourth inverter are both powered by the second power supply voltage.

Clause 12. The level-shifter of any of clauses 1-11, wherein the second power supply voltage is greater than the first power supply voltage.

Clause 13. The level-shifter of clause 10, wherein the seventh transistor and the ninth transistor each comprises an n-type metal-oxide semiconductor (NMOS) transistor and wherein the sixth transistor and the eighth transistor each comprises a p-type metal-oxide semiconductor (PMOS) transistor.

Clause 14. The level-shifter of any of clauses 1-13, wherein the level-shifter is included within a cellular telephone.

Clause 15. A method of level-shifting, comprising:
  charging an inverted input signal to a first power supply voltage responsive to a discharging of an input signal;

switching on a first transistor to discharge an internal node responsive to the charging of the inverted input signal while switching off a second transistor coupled between an inverted level-shifter output signal node and ground responsive to the discharging of the input signal and while a third transistor coupled between the internal node and a power supply node for a second power supply voltage is off;

switching on a fourth transistor coupled between the inverted level-shifter output signal node and the power supply node for the second power supply voltage to charge an inverted level-shifter output signal at the inverted level-shifter output signal node to the second power supply voltage responsive to the discharge of the internal node;

discharging a level-shifter output signal responsive to the charging of the inverted level-shifter output signal to the second power supply voltage;

discharging a feedback signal responsive to the discharging of the level-shifter output signal; and switching on the third transistor responsive to the discharging of the feedback signal.

Clause 16. The method of clause 15, further comprising:
switching off the first transistor responsive to a charging of the input signal to the first power supply voltage;

charging the internal node responsive to the switching off of the first transistor to substantially switch off the fourth transistor;

switching on the second transistor responsive to the charging of the input signal to discharge the inverted level-shifter output signal node: and charging the level-shifter output signal to the second power supply voltage responsive to the discharge of the inverted level-shifter output signal node.

Clause 17. The method of clause 16, further comprising:
charging the feedback signal to the second power supply voltage responsive to the charging of the level-shifter output signal: and switching off the third transistor responsive to the charging of the feedback signal.

Clause 18. A level-shifter, comprising:
a first inverter configured to invert an input signal into an inverted input signal, the first inverter being powered by a first power supply voltage;

a first transistor coupled between an internal node and ground and having a gate coupled to an output terminal of the first inverter;

a second transistor coupled between ground and an inverted level-shifter output signal node for an inverted level-shifter output signal, the second transistor having a gate coupled to the input signal: and a third transistor coupled between the inverted level-shifter output signal node and a power supply node for a second power supply voltage, wherein a gate of the third transistor is coupled to the internal node.

Clause 19. The level-shifter of clause 18, further comprising:
a fourth transistor coupled between the internal node and ground, the fourth transistor having a gate coupled to an output terminal of the first inverter.

Clause 20. The level-shifter of clause 19, wherein the first transistor is larger than the fourth transistor.

Clause 21. The level-shifter of any of clauses 19-20, further comprising:
a fifth transistor coupled between the internal node and the power supply node; and a voltage source configured to bias a gate of the fifth transistor with a bias voltage.

Clause 22. The level-shifter of clause 21, wherein the fourth transistor is larger than the fifth transistor.

Clause 23. The level-shifter of clause 21, wherein the first transistor, the second transistor, and the fourth transistor each comprises an NMOS transistor, and wherein the third transistor and the fifth transistor each comprises a PMOS transistor.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A level-shifter, comprising:
a first inverter configured to invert an input signal into an inverted input signal, the first inverter being powered by a first power supply voltage;

a first transistor coupled between an internal node and ground and having a gate coupled to an output terminal of the first inverter;

a second transistor coupled between ground and an inverted level-shifter output signal node for an inverted level-shifter output signal, the second transistor having a gate coupled to the input signal;

a third transistor coupled between the internal node and a power supply node for a second power supply voltage;

a second inverter configured to invert the inverted level-shifter output signal into a level-shifter output signal, the second inverter being powered by the second power supply voltage; and a buffer configured to buffer the level-shifter output signal into a feedback signal, wherein a gate of the third transistor is coupled to an output terminal of the buffer, and wherein the buffer is powered by the second power supply voltage;

a fourth transistor coupled between the inverted level-shifter output signal node and the power supply node, the fourth transistor having a gate coupled to the internal node;

a fifth transistor coupled between the first transistor and the internal node, the fifth transistor having a gate coupled to the output terminal of the buffer;

a sixth transistor coupled between the internal node and the third transistor, the sixth transistor having a gate coupled to the internal node; and a seventh transistor coupled between the internal node and ground, the seventh transistor having a gate coupled to an output terminal of the first inverter.

2. The level-shifter of claim 1, wherein the first transistor, the second transistor, and the fifth transistor each comprises an n-type metal-oxide semiconductor (NMOS) transistor, and wherein the third transistor and the fourth transistor each comprises a p-type metal-oxide semiconductor (PMOS) transistor.

3. The level-shifter of claim 1, wherein the first transistor is larger than the seventh transistor.

4. The level-shifter of claim 1, further comprising:
an eighth transistor coupled between the internal node and the power supply node; and a voltage source configured to bias a gate of the eighth transistor with a bias voltage.

5. The level-shifter of claim 4, wherein the seventh transistor is larger than the eighth transistor.

6. The level-shifter of claim 4, wherein the buffer comprises a third inverter configured to invert the level-shifter output signal and comprises a fourth inverter configured to invert an output signal from the third inverter to form the feedback signal, the level-shifter further comprising:
- a fifth inverter configured to invert the inverted input signal, wherein the fifth inverter is powered by the first power supply voltage, and
- a ninth transistor coupled between ground and a ground terminal of the third inverter, wherein an output terminal of the fifth inverter is coupled to a gate of the ninth transistor.

7. The level-shifter of claim 6, wherein the third inverter and the fourth inverter are both powered by the second power supply voltage.

8. The level-shifter of claim 1, wherein the second power supply voltage is greater than the first power supply voltage.

9. The level-shifter of claim 6, wherein the seventh transistor and the ninth transistor each comprises an n-type metal-oxide semiconductor (NMOS) transistor and wherein the sixth transistor and the eighth transistor each comprises a p-type metal-oxide semiconductor (PMOS) transistor.

10. The level-shifter of claim 1, wherein the level-shifter is included within a cellular telephone.

* * * * *